(12) United States Patent
Duran et al.

(10) Patent No.: US 9,326,401 B2
(45) Date of Patent: Apr. 26, 2016

(54) COMMUNICATION DEVICE WITH ERGONOMICALLY OPTIMAL AND ROBUST HANDLES

(71) Applicant: HARRIS CORPORATION, Melbourne, FL (US)

(72) Inventors: Jose R. Duran, Williamson, NY (US); David Cipolla, Macedon, NY (US); Jason Scott, W. Henrietta, NY (US); Adam C. Templeton, Honeoye Falls, NY (US)

(73) Assignee: Harris Corporation, Melbourne, FL (US)

( * ) Notice: Subject to any disclaimer, the term of this patent is extended or adjusted under 35 U.S.C. 154(b) by 135 days.

(21) Appl. No.: 14/462,946

(22) Filed: Aug. 19, 2014

(65) Prior Publication Data
US 2016/0057874 A1    Feb. 25, 2016

(51) Int. Cl.
| H05K 7/16 | (2006.01) |
| H04B 1/38 | (2015.01) |
| H05K 5/02 | (2006.01) |
| H05K 5/00 | (2006.01) |

(52) U.S. Cl.
CPC .............. *H05K 5/023* (2013.01); *H05K 5/0017* (2013.01); *H05K 5/0086* (2013.01); *H05K 5/0221* (2013.01); *H05K 5/0226* (2013.01)

(58) Field of Classification Search
CPC ..... G06F 1/166; G06F 1/1679; G06F 1/1681; H05K 5/023; H05K 5/0017; H05K 5/0086; H05K 5/0221

USPC .............. 361/679.31–679.4, 679.55–679.59, 361/726, 724, 725, 727; 312/7.1; 455/90.1–90.3
See application file for complete search history.

(56) References Cited

U.S. PATENT DOCUMENTS

| 5,020,151 | A | * | 5/1991 | Sampei | ............... | B60R 11/0205 |
| | | | | | | 312/7.1 |
| 5,216,904 | A | * | 6/1993 | Isaki | ...................... | B60K 37/04 |
| | | | | | | 16/445 |
| D373,208 | S | | 8/1996 | Yuen | | |
| 8,135,358 | B1 | * | 3/2012 | Hesse | .................. | H04B 1/0096 |
| | | | | | | 455/100 |
| 8,416,563 | B2 | * | 4/2013 | Hou | ...................... | H05K 7/1489 |
| | | | | | | 211/26 |
| 8,496,210 | B2 | * | 7/2013 | Chang | ..................... | G06F 1/181 |
| | | | | | | 248/221.11 |
| 2015/0181743 | A1 | * | 6/2015 | Skirmont | ............. | H05K 7/1409 |
| | | | | | | 361/679.58 |

* cited by examiner

*Primary Examiner* — Nidhi Thaker
(74) *Attorney, Agent, or Firm* — Fox Rothschild LLP; Robert J. Sacco; Carol E. Thorstad-Forsyth

(57) ABSTRACT

A communication device (100) comprising: a housing (106) having a front panel (132) and a plurality of sidewalls (134); a plurality of electronic connectors (108-112, 124-128) disposed on said front panel; at least one handle (102, 104) pivotally coupled to a first sidewall such that the handle is transitionable between a locked closed position and an unlocked open position; and at least a first lock mechanism (140, 142) coupled to the housing and the handle so as to facilitate a selective transition of the handle from its locked closed position to its unlocked open position. The handle is angled $N_0$ degrees relative to the first sidewall and resides adjacent to the electronic connectors when in its locked closed position. The handle is angled N degrees in a direction away from the first sidewall when in its unlocked open position, where N has a value greater than zero.

19 Claims, 13 Drawing Sheets

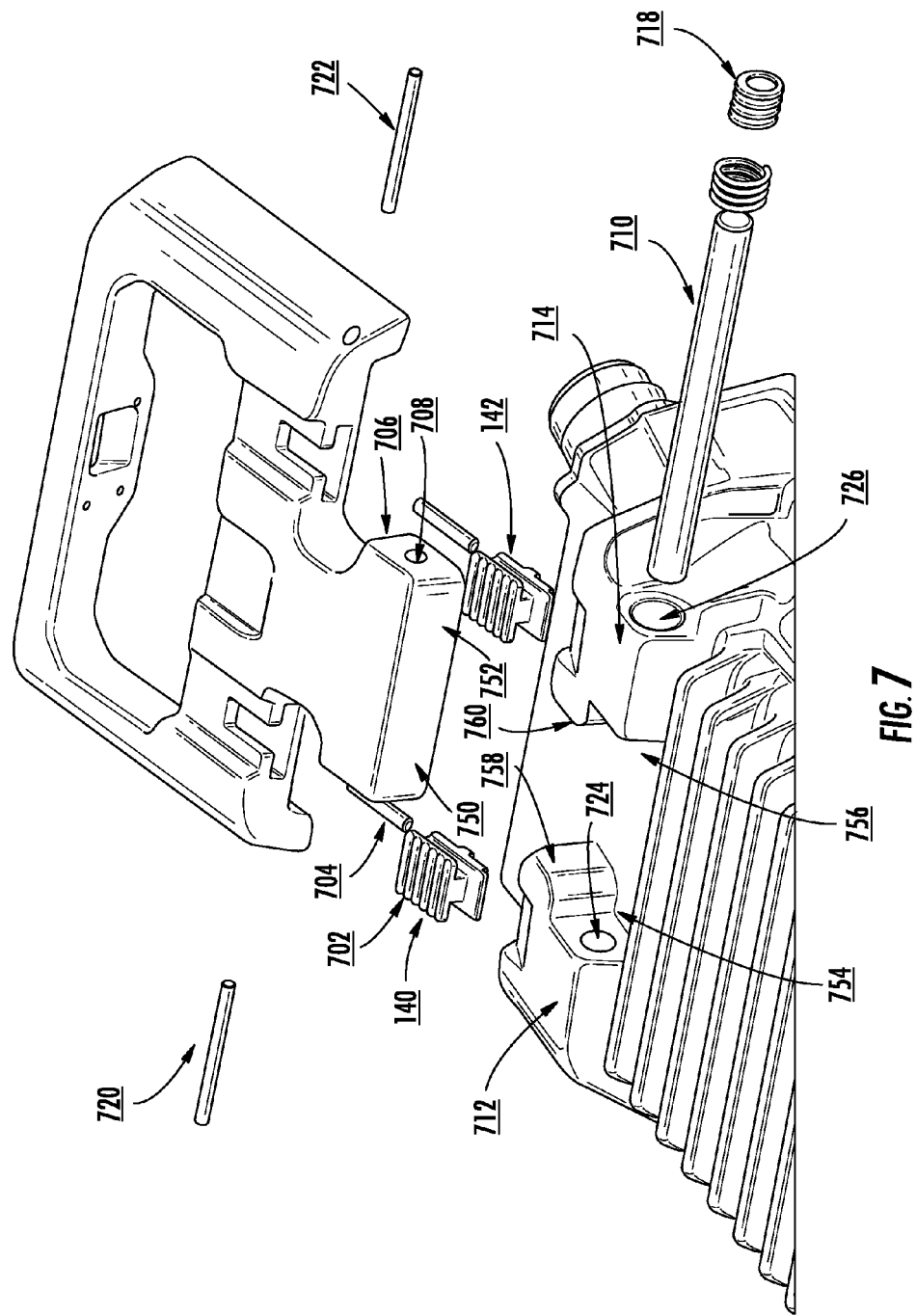

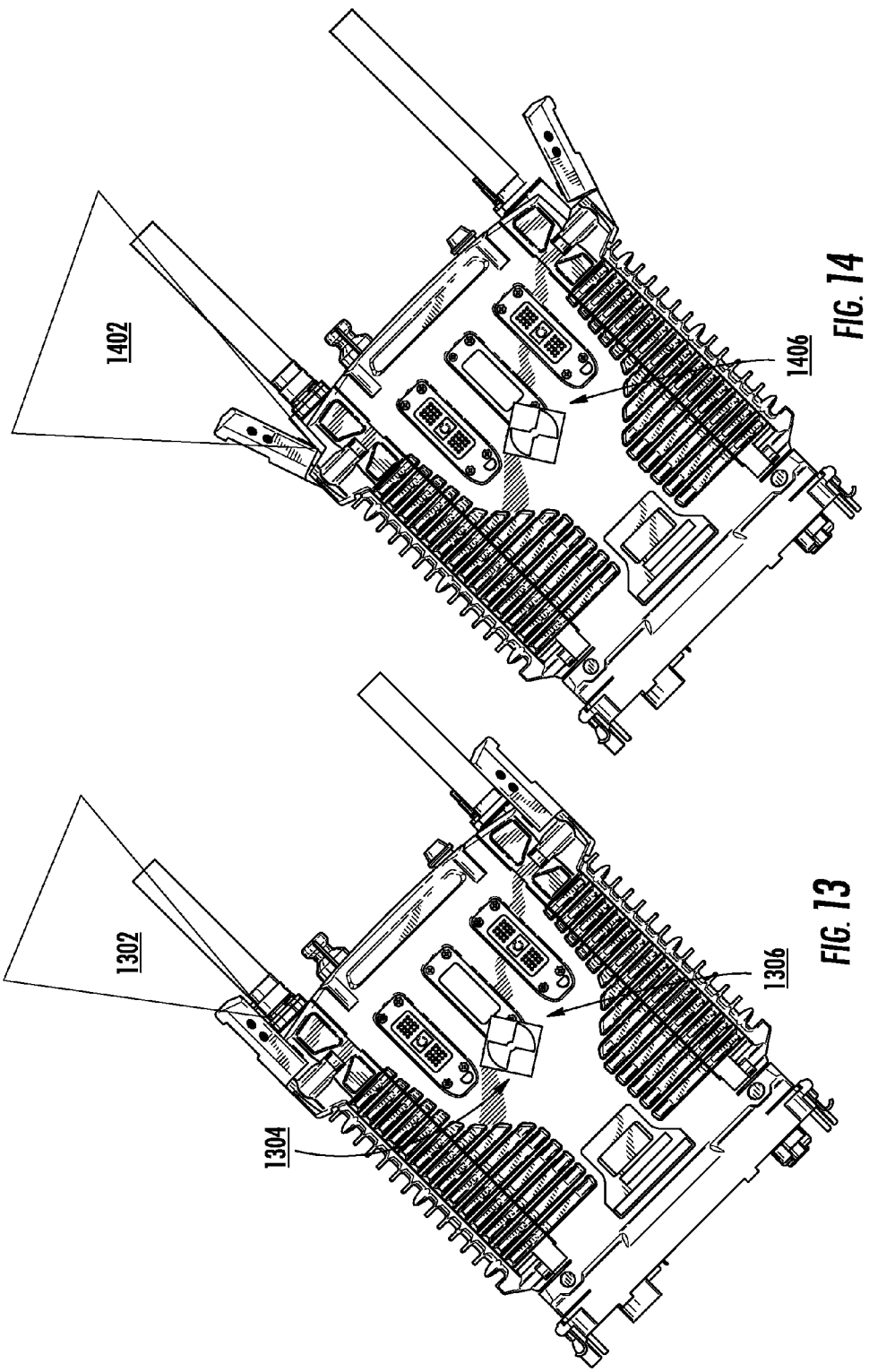

COMMUNICATION DEVICE WITH ERGONOMICALLY OPTIMAL AND ROBUST HANDLES

BACKGROUND OF THE INVENTION

1. Statement of the Technical Field

The inventive arrangements relate to communication devices. More particularly, the invention concerns handles for communication devices which optimize user experience by eliminating typical usability issues found with conventional carrying handles.

2. Description of the Related Art

There are many communication devices known in the art. Some of these communication devices include handles for enabling a user to carry the same. The handles are fixedly secured to the housing of the communication device. As such, the handles have a static position relative to the housing, and therefore are not optimized for certain applications (e.g., military applications).

SUMMARY OF THE INVENTION

The present invention concerns a communication device. The communication device comprises: a housing having a front panel and a plurality of sidewalls; a plurality of electronic connectors disposed on the front panel; at least one handle facilitating carrying of the communication device by a human and being pivotally coupled to a first sidewall of the plurality of sidewalls such that the handle is transitionable between a locked closed position and an unlocked open position; and a first lock mechanism coupled to the housing and the handle so as to facilitate a selective transition of the handle from the locked closed position to the unlocked open position. The first lock mechanism also at least partially prevents an unintentional transition of the handle from the unlocked open position to the locked closed position when the communication device is being carried via the handle. A second lock mechanism may be coupled to the housing and the handle so as to prevent an accidental or unintentional transition of the handle from its locked closed position to its unlocked open position.

The handle is angled to an initial position or No degrees (e.g., zero degrees) relative to the first sidewall and resides adjacent to the electronic connectors when in its locked closed position. In contrast, the handle is angled N degrees in a direction away from the first sidewall when in its unlocked open position, where N has a value greater than zero (e.g., 18). The value of N may be selected based on a size of each electronic connector and a distance that a distal end of the handle resides from the housing when the handle is in its locked closed position and/or unlocked open position. An angle of rotation of the handle is limited at least partially by a shape thereof.

BRIEF DESCRIPTION OF THE DRAWINGS

Embodiments will be described with reference to the following drawing figures, in which like numerals represent like items throughout the figures, and in which:

FIG. 7 is an assembly view that is useful for understanding how handles are coupled to a communication device.

FIGS. 13 and 14 provide schematic illustrations that are useful for understanding how a communication device's center of gravity changes when a handle is transitioned from its locked closed position to its unlocked open position.

DETAILED DESCRIPTION

Figure 1:
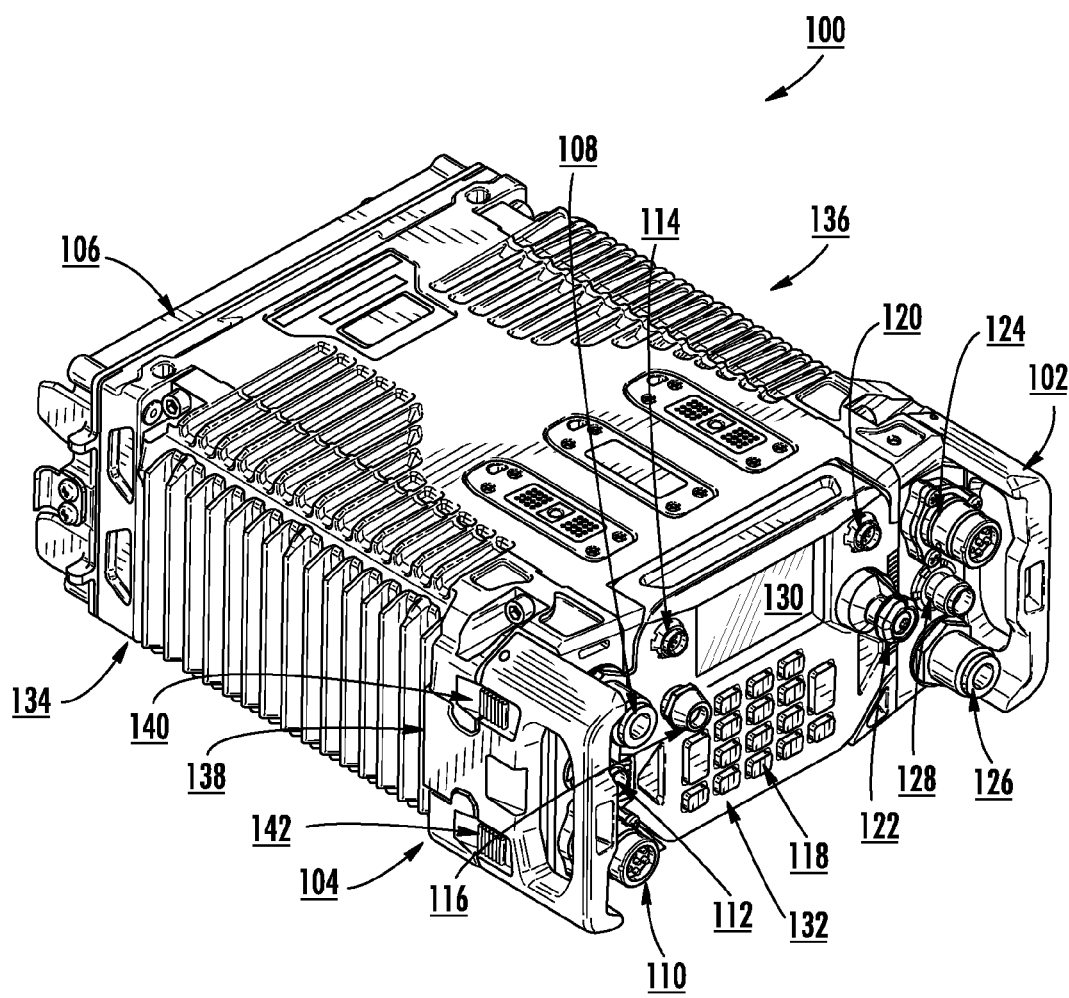
FIG. 1 provides a front perspective view of an exemplary communication device with handles in their locked closed positions.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects as illustrative. The scope of the invention is, therefore, indicated by the appended claims. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout the specification may, but do not necessarily, refer to the same embodiment.

Furthermore, the described features, advantages and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

As used in this document, the singular form "a", "an", and "the" include plural references unless the context clearly dictates otherwise. Unless defined otherwise, all technical and scientific terms used herein have the same meanings as commonly understood by one of ordinary skill in the art. As used in this document, the term "comprising" means "including, but not limited to".

Overview

The present invention concerns improved handles for use with communication devices. The term "handle", as used herein, refers to a part by which an object is carried by a human. Each handle is hingedly coupled to a respective sidewall of a communication device via at least one hinge. The hinge facilitates the selective transition of the handle from a locked closed position to an unlocked open position. In the locked closed position, the handle is aligned with the respective sidewall of the communication device, and securely coupled to a housing of the communication device via at least one lock mechanism. Since the form factor of each handle conforms to the outer periphery of the housing when in its locked closed position, the handle configuration of the present invention allows the communication device to fit within a pre-defined space within a vehicle for storage and to be used in conjunction with other vehicle equipment. Notably, when in the locked closed position, the handle profile conforms with the peripheral surface of the housing. In the unlocked open position, the handle is angled so as to protrude out and away from the respective sidewall of the communication device. The angle of the handle relative to the respective sidewall is within the range of 0°-90° (e.g., 18°). The hinge allows the handle to be pivoted away from the communication device's body when access to I/O connectors is needed and/or a user desires to carry the communication device.

Notably, the handle configuration of the present invention provides a communication device which overcomes various drawbacks of conventional communication devices (such as that discussed in the background section of this document). For example, in conventional communication devices, the handles are not optimized for the following three main functions thereof: protect the front face of the communication device during use and/or storage; allow a user to carry the communication device unencumbered and without risk of injury; and allow the user unimpeded access to the I/O connectors disposed on the face of the communication device. In contrast, the handles of the present invention are advantageously designed to: function as a protective guard for the I/O connectors when in both their closed and unlocked open positions; allow a user to carry the communication device without being encumbered by the I/O connectors or other I/O devices attached thereto; provide thermally low conduction to a user's hand so as to eliminate any risk of blistering or burning thereto; and allow unimpeded access to the I/O connectors such that I/O devices (e.g., key loaders) can be coupled to the communication device without difficulty and use of extension cables. The handles are also designed to provide: a dedicated area for mounting accessories (e.g., a handset) to the communication device; and a larger opening for grasping the handles as compared to that provided by the handles of conventional communication devices. The handles can also be easily replaced in the field if damaged. In some scenarios, the lock mechanism(s) of the present invention prevent the unintentional unlocking of the handle from the communication device's body as a result of vibrational forces and/or other forces exerted thereon when dropped.

Communication Device

Exemplary architectures for a communication device 100 with novel handles 102, 104 will now be discussed in relation to FIGS. 1-16. As shown in FIGS. 1-16, the communication device 100 includes, but is not limited to, a portable manpack radio or man-portable, tactical software defined combat-net radio covering a predefined (e.g., 30-512 MHz) frequency range. As such, the communication device 100 comprises a housing 106 in which electronic components (not shown) are housed. The electronic components include, but are not limited to, transceivers, filters, switches, processors, data stores, and other hardware. The listed electronic components are well known in the art, and therefore will not be described herein.

The communication device 100 also comprises various IO components. For example, as shown in FIG. 1, a number of I/O components 108-130 are disposed on a front panel 132 of the housing 106. The I/O components include a display screen 130, a keypad 118, and a plurality of I/O connectors 108, 110, 112, 114, 116, 120, 122, 124, 126. The display screen 130 and keypad 118 facilitate user-software interactions for controlling operations of the communication device 100. The I/O connectors facilitate the attachment and detachment of accessories to the communication device 100. The accessories may include antennas, handsets, and key loaders. As such, the I/O connectors may include, but are not limited to, Radio Frequency ("RF") audio connectors, Audio Data Fill ("ADF") type connectors, Bayonet Neill-Concelman ("BNC") type connectors, and Threaded Neill-Concelman ("TNC") type connectors. Each of the listed connectors is well known in the art, and therefore will not be described herein.

Figure 2:
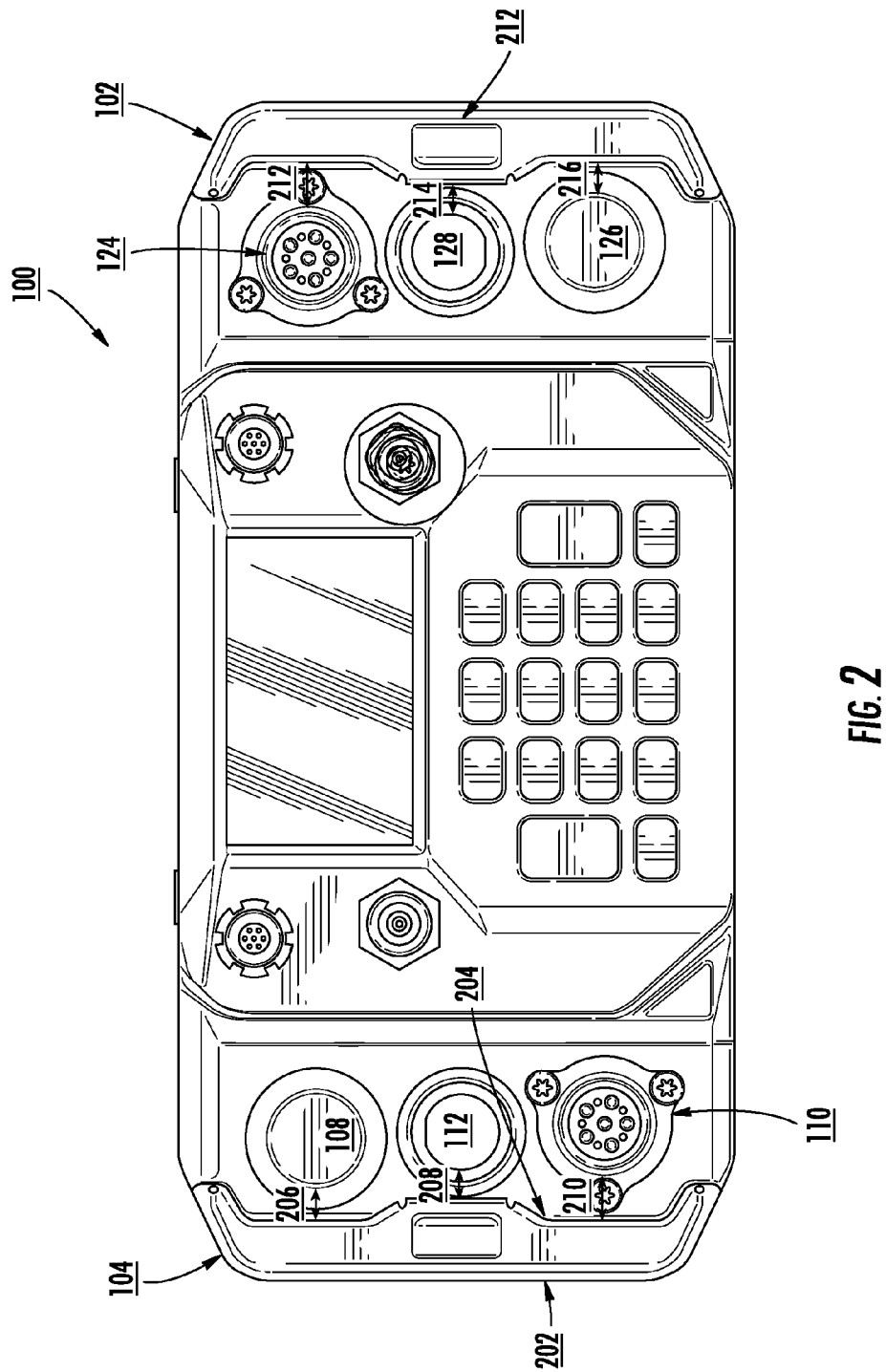
FIG. 2 provides a front view of the communication device shown in FIG. 1.
Figure 3:
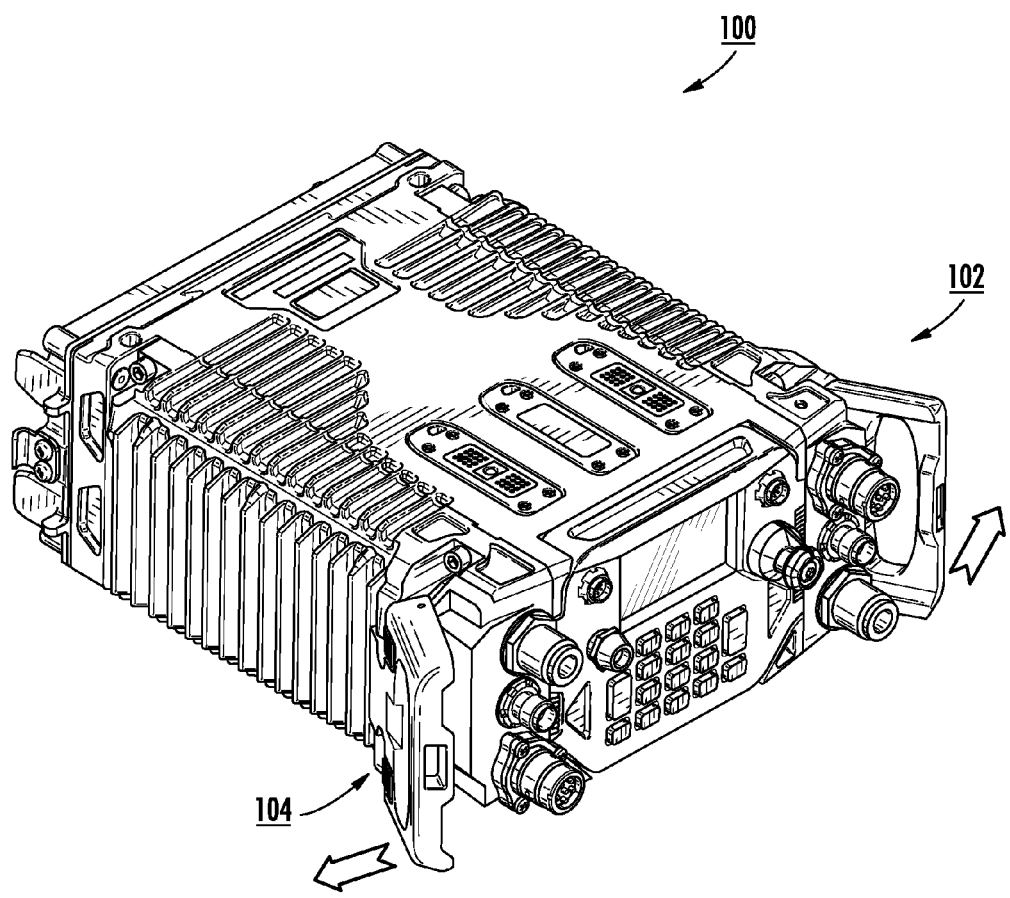
FIG. 3 is a front perspective view of the exemplary communication device in FIG. 1 with handles in their unlocked open positions.
Figure 6:
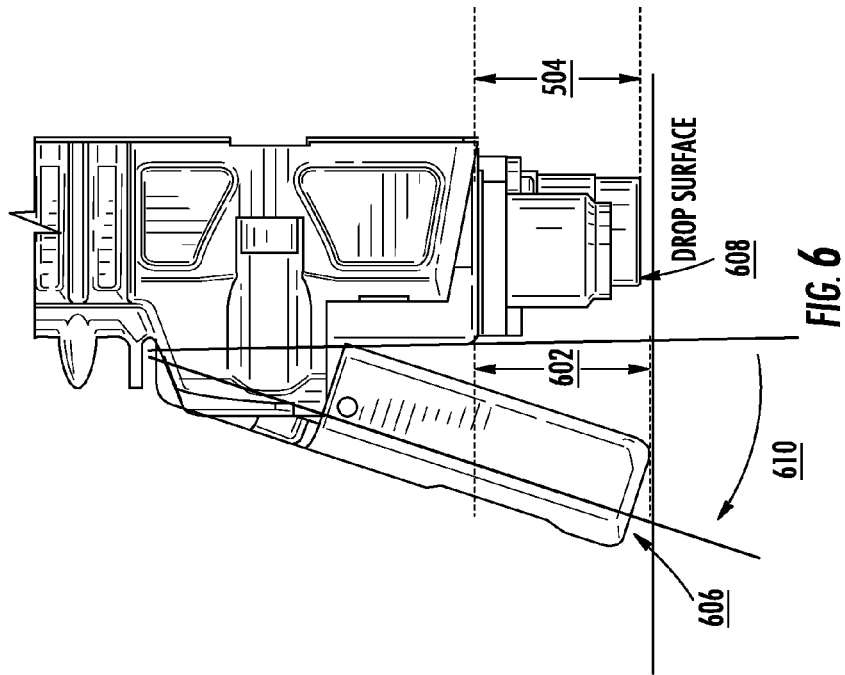
FIGS. 5-6 provide schematic illustrations that are useful for understanding an angle of rotation of handles.
Figure 5:
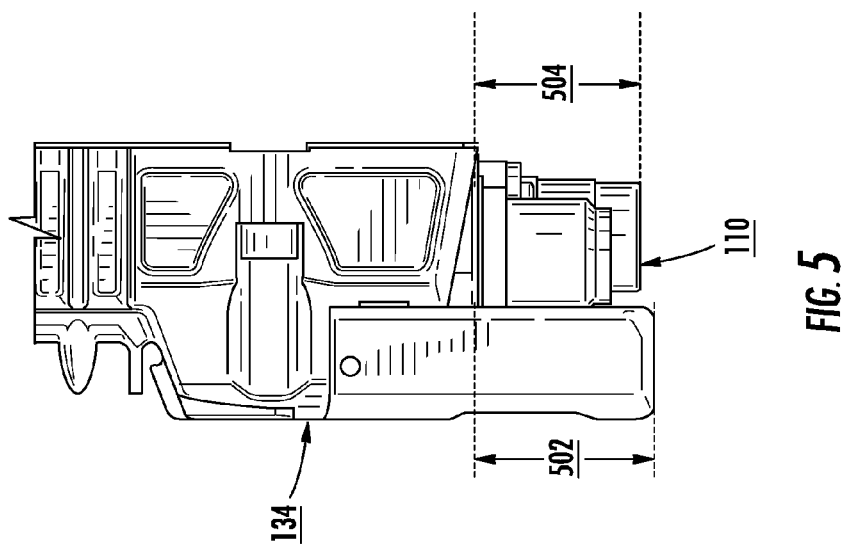
Figure 8:
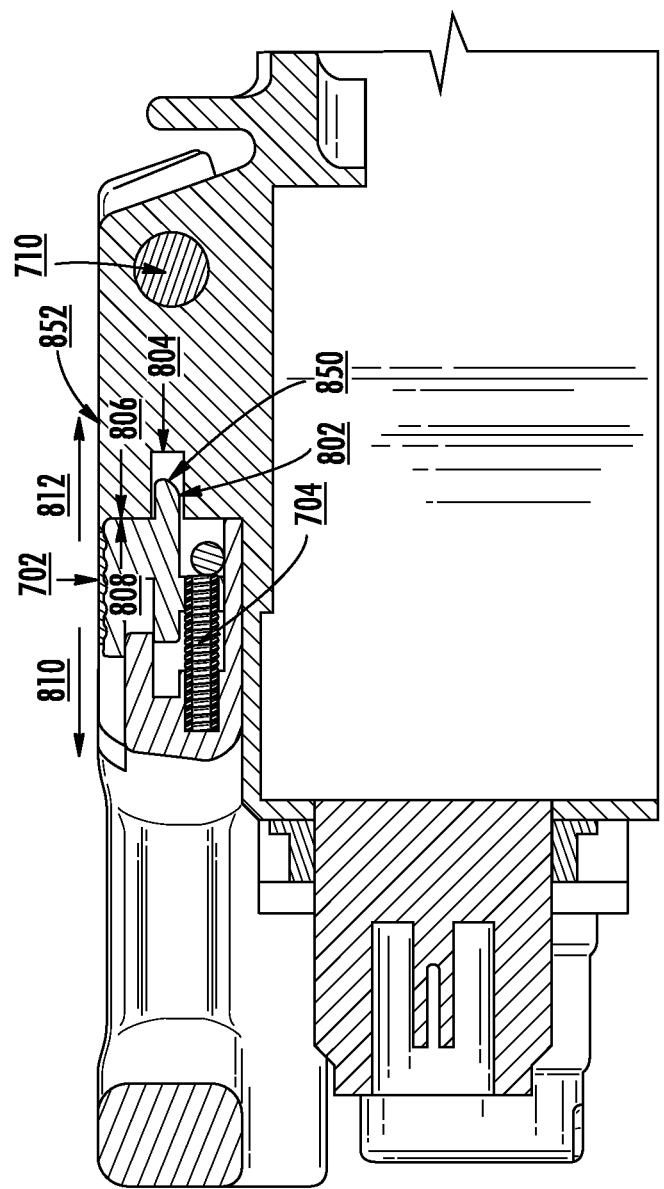
FIGS. 8 and 9 each provide a cross-sectional view that is useful for understanding how a handle is transitioned from its locked closed position to its unlocked open position.
Figure 9:
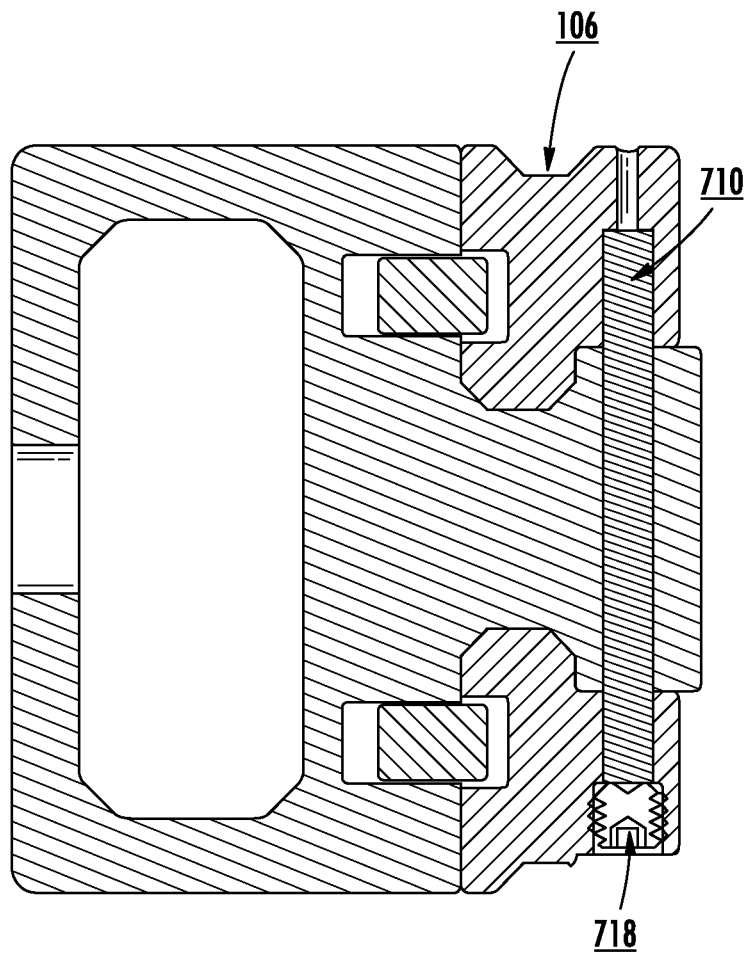

The I/O components are protected from damage during drop and collision events by the handles 102, 104. In this regard, the handles 102, 104 are designed to protrude out and away from the front panel 132 of the housing 106 when in their locked closed positions, as shown in FIGS. 1, 2 and 5. The distance 502 that each handle 102, 104 extends from the front panel 132 while in its locked closed position is greater than the distance 504 that each I/O connector 110, 124 extends from the front panel 132. Also, each handle 102, 104 is designed such that a distal end 606 thereof resides a greater distance 602 from the housing 106 than a distal end 608 of each I/O connector (e.g., I/O connector 110 or 124) while in its unlocked open position, as shown in FIG. 6. As such, external forces are exerted on the handles 102, 104 by external surfaces during drop and collision events, as opposed to the I/O connectors 108-116, 120-126.

Each handle 102, 104 is coupled to a respective sidewall 134, 136 of the communication device 100. In the locked closed position, the handle 102, 104 is angled to an initial position (e.g., 00) relative to the respective sidewall 134 or 136, as shown in FIG. 5. In contrast, the handle 102, 104 is angled N° relative to the respective sidewall 134 or 136 (as shown by arrow 610 of FIG. 6) when in its unlocked open position, where N has a value falling within the range of 0° to 180°. In some scenarios, the value of N (e.g., 18) is selected so that the handle 102, 104 still protects the I/O connectors 108-116, 120-126 from damage during drop and/or collision events. Accordingly, the following parameters assist in selecting the value of N: the size of the I/O connectors (e.g., how far each I/O connector extends from the front panel of the housing); and the distance that the distal end 606 of each handle 102, 104 resides from the housing 106 when the handle is in its locked closed position and/or unlocked open position.

Each handle 102, 104 is transitionable between its locked closed position and unlocked open position via a hinge mechanism 138 and at least one lock mechanism 140, 142. In some scenarios (such as that shown in FIGS. 1-14), two lock mechanisms 140, 142 are provided for each handle. The second lock mechanism facilitates the elimination of accidental and/or unintentional unlocking of the handle 102, 104. The present invention is not limited in this regard. For example, a single lock mechanism or more than two lock mechanisms could be provided for each handle.

Each lock mechanism 140, 142 comprises a latch 702 and a spring 704. In some scenarios, the latch 702 is formed of metal (e.g., stainless steel) or plastic. The latch 702 joins/locks the respective handle 102, 104 to the housing 106 of the communication device 100, while allowing for the selective separation/unlocking thereof. In this regard, the latch 702 is coupled to the handle 106 via coupling mechanisms 720, 722 (e.g., screws). The latch 702 comprises a protrusion 802 for sliding insertion into a cavity 804 formed in the housing 106. When the protrusion 802 resides in the cavity 804, the latch 702 is said to be in its engaged position. In this engaged position, the handle 102, 104 is secured in its locked closed position. The latch 702 is maintained in its engaged position by the spring 704. The spring 704 normally biases the latch 702 in the direction 812 towards the cavity 804.

In order to transition the latch 702 from its engaged position, the latch 702 is moved in the direction shown by arrow 810, which is opposite to the direction shown by arrow 812. In effect, the latch 702 compresses spring 704. Also, the protrusion 802 is removed from the cavity 804. When the protrusion 802 is removed from the cavity 804, the latch 702 is said to be in its disengaged position. In this disengaged position, the handle 102, 104 can be pivoted away from the housing 106, as shown in FIG. 6. The handle 102, 104 can be pivoted until it reaches a given angular position relative to the housing which is defined by its limited angle of rotation thereof.

Notably, a specified amount of force is needed to close the handle 102, 104 so that the handle does not unintentionally return to its locked closed position while the communication device is being carried by a user. In this regard, the center of gravity of the communication device is selected to have a position when the handle is in its unlocked open position which at least partially ensures that the handle will not close when the communication device is being carried by a user via the handle. Also, the protrusion 802 of the latch 702 is formed with a chamfered surface 850. When the handle 102, 104 is in its open position, the chamfered surface 850 contacts an angled surface 852 of an indention 1250 formed in the housing. The contact arrangement between the surfaces 850, 852 and the center of gravity position ensures that the handle 102, 104 will only close when the specified amount of force is applied thereto in the direction of the housing. This contact arrangement also facilitates a one handed closure of the handle 102, 104 since the angled surface 852 causes the latch 702 to move in the direction of arrow 810 as the handle is being pushed towards the housing.

When the latch 702 reaches its closed position, the spring 704 once again biases the latch 702 towards the housing 106. In this way, the latch 702 snaps into its engaged position, thereby locking the handle in its closed position.

The pivoting of the handle 102, 104 is facilitated by the hinge mechanism 138. The hinge mechanism 138 comprises a barrel member 706 and a pivot member 710. The barrel member 702 comprises a portion of the handle 702, 704 which has an aperture 708 formed therethrough. The aperture 708 is sized and shaped to receive the pivot member 710. In this regard, the aperture 708 and the pivot member 710 have circular cross-sectional profiles. However, the diameter of the aperture 708 is slightly larger than the diameter of the pivot member 710. In effect, the barrel member 706 can rotate about the pivot member 710.

The pivot member 710 is coupled to the housing 106 via retaining structures 712, 714 and a coupling mechanism 718 (e.g., a screw). Each retaining structure 712, 714 has an aperture 724, 726 formed therein. The apertures 724, 726 are sized and shaped for receiving at least a portion of the pivot member 710. More particularly, the pivot member 710 comprises an elongate post inserted through aperture 714 and partially into aperture 724. The apertures 714, 724 are aligned with each other such that the pivot member 710 provides a fixed axis of rotation for the barrel member 706.

Notably, the barrel member 706 is designed to ensure that the apertures 708, 724, 726 are aligned with each other during fabrication and maintain alignment throughout the use of the communication device. In this regard, the barrel member 706 has a generally T-shape with left/left protruding parts 750, 752. The protruding parts 750, 752 are sized and shaped to fit within respective insert spaces 754, 756 formed in the housing 106. Retaining structures 758, 760 retain the protruding parts 750, 752 in insert spaces 754, 756, as well as provide structural support to the protruding parts 750, 752 when external forces are applied to the handles by a user or other surface/object. As such, the retaining structures 758, 760 ensure that the latches 702, 704 and pin 710 do not take all of the shock during drop or collision events.

Figure 10:
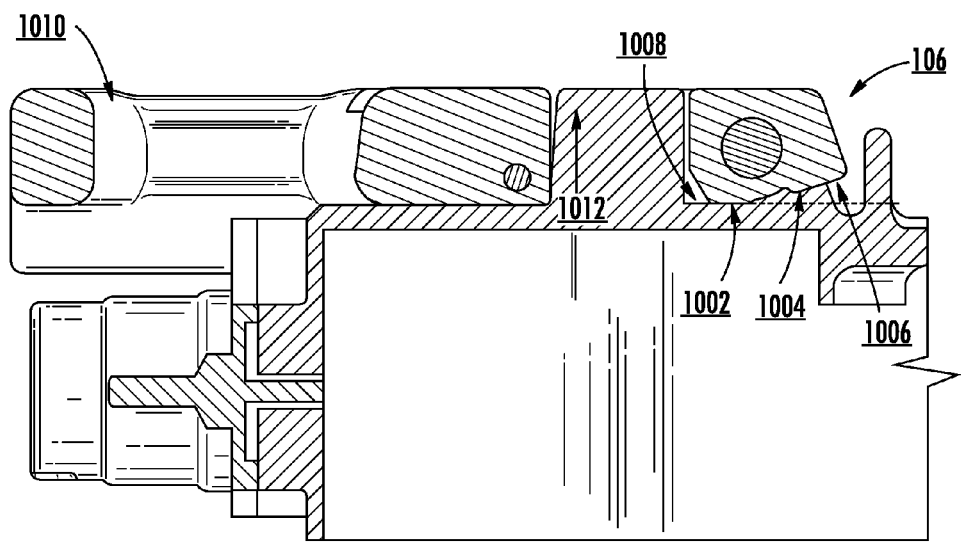
FIGS. 10 and 11 each provide a schematic illustration that is useful for understanding how a handle's angle of rotation is limited.
Figure 11:
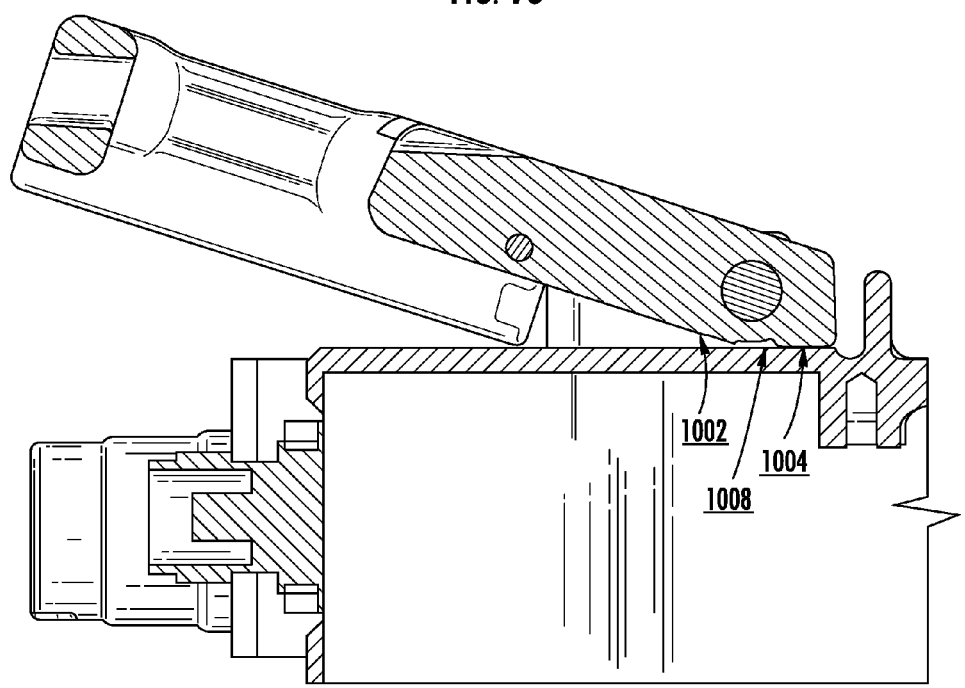

The barrel member 706 is also designed to allow only a limited angle of rotation for the handle 702, 704 (e.g., an 18° angle of rotation). This is schematically shown by FIGS. 10 and 11. As shown in FIGS. 10-11, the barrel member 706 comprises two bottom engagement surfaces 1002 and 1004, which are angled relative to each other as shown by arrow 1006. In effect, engagement surface 1002 abuts a surface 1008 of the housing 106 when the handle is in its locked closed position, while the engagement surface 1004 does not contact any housing surface. In contrast, engagement surface 1004 abuts surface 1008 when the handle is pivoted away from the housing by a certain pre-defined amount, while the engagement surface 1002 does not contact any housing surface. In this way, the engagement surface 1004 ensures that only a limited angle of rotation is provided for the handle.

Notably, the handles 702, 704 are designed so as to not interfere with connecting accessories to the I/O connectors 108-116, 120-126. For example, as shown in FIG. 2, each handle 702, 704 has a grip portion 202 with an inner surface 204 shaped so as to ensure that the I/O connectors 108/110/112 or 124/126/128 are not covered by the handle. Additionally, the inner surface 204 is shaped such that it resides a certain distance 206, 208, 210 from each I/O connector, which is sufficient for ensuring that the handle does not interfere with connecting and/or disconnecting mating connectors of accessories/cables to the I/O connectors.

The handles 702, 704 are designed such that certain accessories (e.g., a keyloader 1500 of FIGS. 15-16) can be coupled to the communication device 100 without use of extension cables (not shown). In this regard, each handle 702, 704 is designed such that it extends only a certain distance 1602 from the front panel 132 when it is in its locked position.

Distance 1602 is selected such that the accessory can be rotated without interference from the handles when it is being directly coupled and/or decoupled from the communication device 100. When the accessory is fully coupled to the communication device 100, the accessory is spaced apart from the handle as shown by arrow 1604. As should be understood, the handles 702, 704 can be placed in their unlocked open positions if a user would like additional space between the handles and the I/O connectors during the coupling/decoupling of an accessory.

The handles 702, 704 are also designed with dedicated areas for mounting accessories thereon. For example, each handle 702, 704 has an aperture 212 formed through the grip portion 202 thereof. The aperture 212 is sized and shaped to allow an accessory (e.g., a handset) to be clipped onto or tied to the handle. The aperture 212 is formed at a location on the handle so as to minimize any interference by the accessory when other accessories are being coupled/decoupled to an I/O connector 108, 110, 112, 124, 126 or 128.

In some scenarios, the handles 702, 704 are formed of a material which provides thermally low conduction to a user's hand so as to eliminate any risk of blistering or burning thereto, while also having enough strength to ensure that breakage thereof does not occur during use of the communication device 100. For example, each handle 702, 704 is formed of an over molded plastic on a metal core (e.g., aluminum). The present invention is not limited in this regard. Any known or to be known material or combination of materials can be used herein without limitation provided that there is minimal risk of (1) blistering or burning of a user's hand and (2) breakage of the handle during use of the communication device 100.

In those and other scenarios, the communication device 100 is designed for storage and use in a vehicle (not shown). Therefore, the communication device 100 has a size and shape suitable to fit within a particular insert space (not shown) within the vehicle. The insert space is relatively small. Therefore, the handles 102, 104 must be in their locked closed positions in order for the communication device 100 to fit into the insert space. When the handles are in their locked closed positions, outer surfaces 1010 thereof are aligned with outer surfaces 1012 of the housing 106, as shown in FIG. 10. In this regard, the form factor of each handle conforms to the outer periphery of the housing when in its locked closed position. Also, each handle's profile conforms with the peripheral surface of the housing when in its locked closed position. In effect, the outer surface 1010 does not protrude out and away from a plane defined by outer surface 1012 of the communication device 100. As such, the handles 102, 104 do not prevent or encumber the insertion of the communication device 100 into the insert space of the vehicle.

Notably, the handles 102, 104 enable easy carrying of the communication device 100 with accessories coupled to the I/O connectors thereof. This is at least partially due to the following factors: (1) the provision of larger hand openings when the handles 102, 104 are in their unlocked open positions as compared to that of conventional communication devices; (2) the increased space between the grip portion 202 of each handle 102, 104 and the respective I/O connectors when the handles 102, 104 are in their unlocked open positions, as compared to that of conventional communication device architectures; and (3) the better positioning of the center of gravity of the communication device when being carried using the handles in their unlocked open position as compared to that of conventional communication devices.

Figure 12:
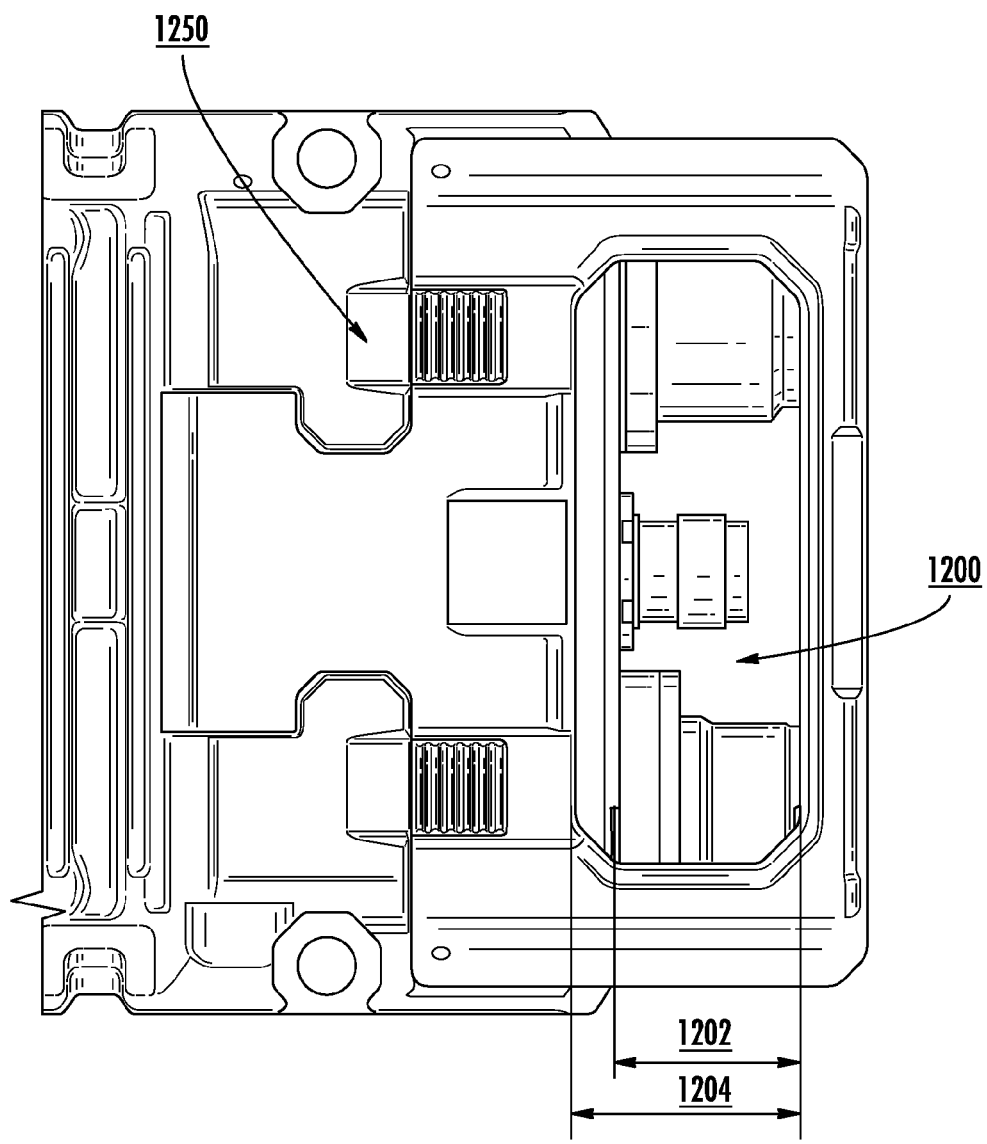
FIG. 12 is a schematic illustration that is useful for understanding how a hand opening for carrying a communication device increases in size when a handle is transitioned from its locked closed position to its unlocked open position.
Figure 15:
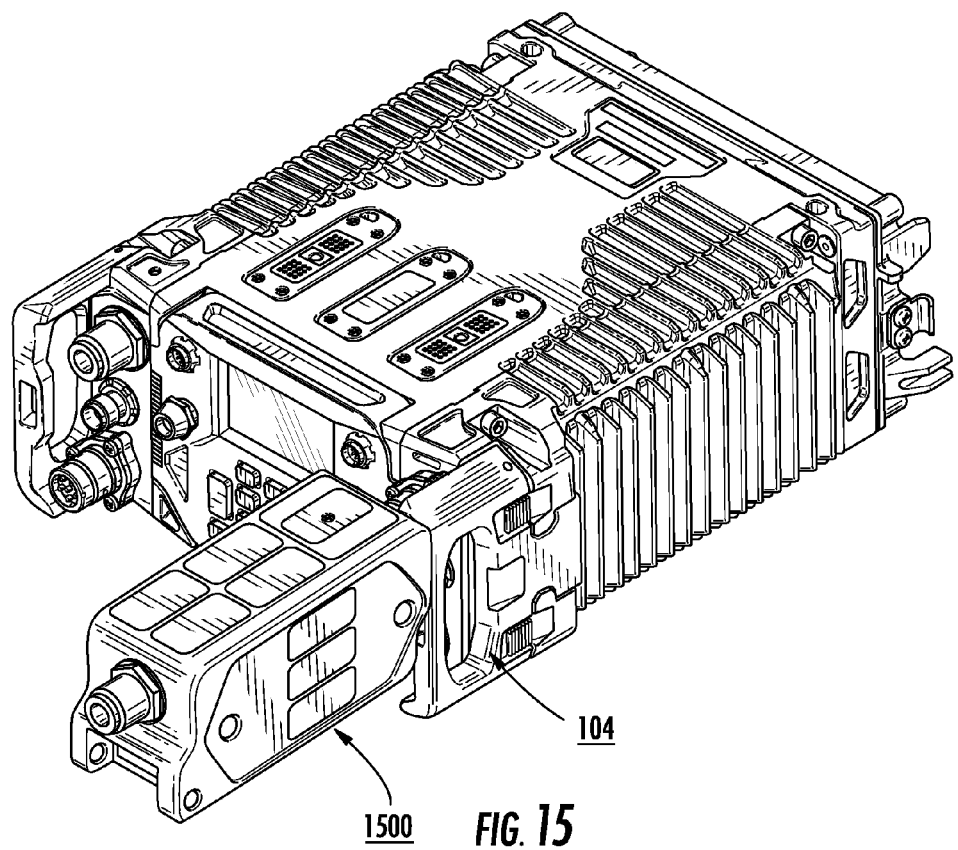
FIGS. 15 and 16 provide schematic illustrations that are useful for understanding how an accessory can be coupled to a communication device without interference from a handle.
Figure 16:
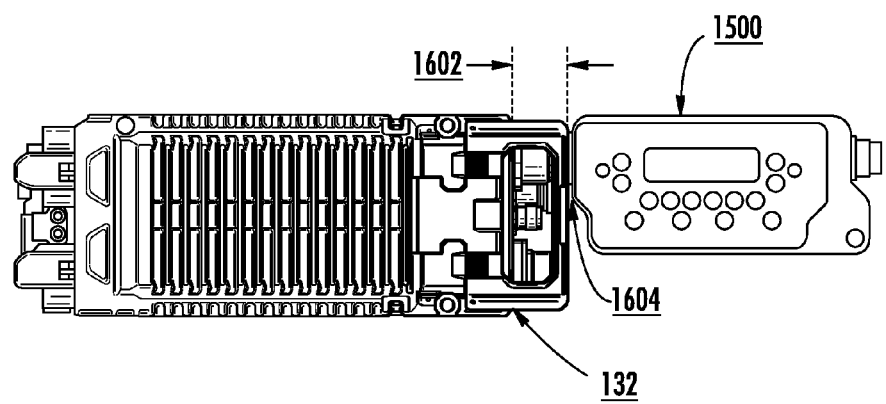

Factor (1) is schematically illustrated in FIG. 12. As shown in FIG. 12, a hand opening 1200 is provided in each handle. The hand opening 1200 has a first width 1202 when the handle is in its locked closed position, and a second width 1204 when the handle is in its unlocked open position. The first width 1202 is smaller than the second width 1204.

Figure 4:
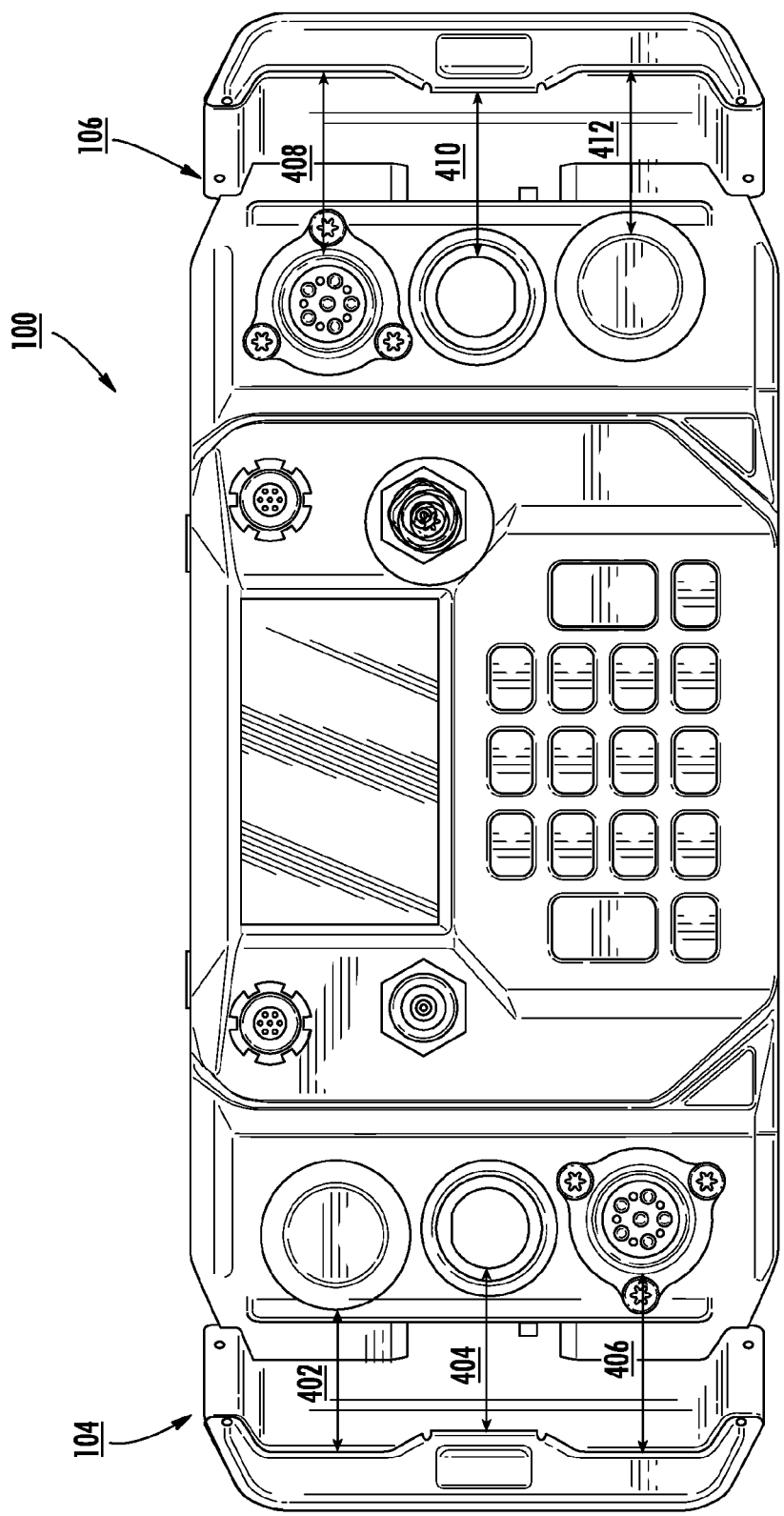
FIG. 4 provides a front view of the communication device shown in FIG. 3.

Factor (2) is schematically illustrated in FIGS. 2, 4, 13 and 14. As shown in FIGS. 2 and 4, the distance 402-412 between each handle and the respective I/O connectors is increased when the handle is in its unlocked open position, as compared to such distance 206-216 when the handle is in its locked closed position. In effect, the user's cone of access 1402 when the handles are in their unlocked open positions is larger as compared to that 1302 when the handles are in their locked closed positions, as shown in FIGS. 13 and 14.

Factor (3) is schematically illustrated in FIGS. 13 and 14. As shown in FIGS. 13 and 14, the center of gravity 1304 is at a first location 1306 when the communication device 100 is being carried using the handles 102, 104 in their locked closed positions, and a second location 1406 when the handles are in their unlocked open positions. When the center of gravity 1304 is at the first location 1306, the communication device 100 tends to tip towards the person carrying the same. In contrast, the communication device 100 does not tip towards the user carrying the same when the center of gravity 1304 is in its second location. As such, the user is provided with an improved means to carry the communication device 100 in which any connected accessories do not interfere therewith.

Exemplary Method

Figure 17:
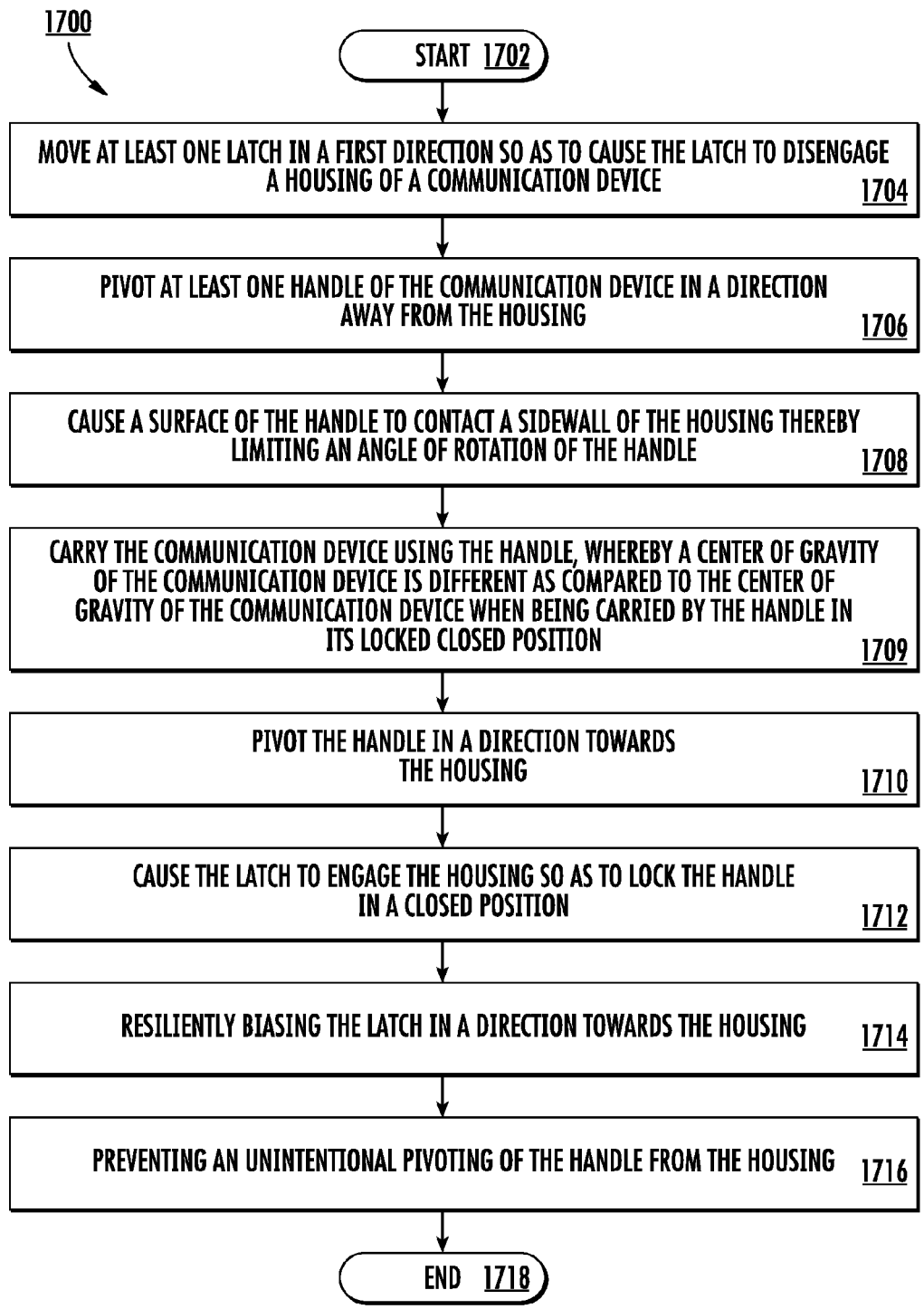
FIG. 17 is a flow diagram of an exemplary method for carrying a communication device.

Referring now to FIG. 17, there is a flow diagram of an exemplary method 1700 for carrying a communication device (e.g., communication device 100 of FIG. 1). The method 1700 begins with step 1702 and continues with step 1704. In step 1704, at least one latch (e.g., latch 702 of FIG. 7) is moved in a first direction so as to cause the latch to disengage a housing (e.g., housing 106 of FIG. 1) of the communication device. Next in step 1706, at least one handle (e.g., handle 102 and/or 104 of FIG. 1) is pivoted in a direction (e.g., direction 610 of FIG. 6) away from the housing. The handle is pivoted in steps 1706-1708 until a sidewall (e.g., sidewall 1004 of FIGS. 10-11) is caused to abut a sidewall (e.g., sidewall 1008 of FIGS. 10-11) of the housing. In this way, an angle of rotation of the handle is limited to a particular value (e.g., to 18°). Once the handle is placed in its unlocked open position, a user can carry the communication device using the handle, as shown by step 1709. In this case, the center of gravity of the communication device is different as compared to the center of gravity of the communication device when being carried by the handle in its closed position.

Thereafter, the handle can be transitioned from its unlocked open position to its locked closed position as shown by steps 1710-1714. Step 1710 involves pivoting the handle in a direction towards the housing. Step 1712 involves causing the latch to engage the housing so as to lock the handle in a locked closed position. Step 1714 involves resiliently biasing the latch in a direction towards the housing. Unintentional pivoting of the handle is prevented by the inclusion of a second latch, as shown by step 1716. Subsequently, step 1718 is performed where method 1700 ends.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application. Thus, the breadth and scope of the present invention should not be limited by any of the above described embodiments. Rather, the scope of the invention should be defined in accordance with the following claims and their equivalents.

We claim:

1. A communication device, comprising:
a housing having a front panel, and a plurality of sidewalls perpendicular to the front panel;
a plurality of electronic connectors disposed on said front panel;
at least one handle facilitating carrying of the communication device by a human, said handle pivotally coupled to a first sidewall of said plurality of sidewalls such that said handle is transitionable between a locked closed position and an unlocked open position, said handle angled $N_O$ degrees relative to said first sidewall and residing adjacent to said plurality of electronic connectors when in said locked closed position, wherein $N_O$ has a value which causes the handle to be substantially aligned with the first sidewall, and angled N degrees in a direction away from said first sidewall when in said unlocked open position, where N has a value greater than zero and an angle of rotation of the handle is limited at least partially by a shape of the handle; and
at least a first lock mechanism coupled to said housing and said handle so as to facilitate a selective transition of said handle from said locked closed position to said unlocked open position, wherein said first lock mechanism comprises a latch and a spring, whereby said first lock mechanism at least partially prevents an unintentional transition of the handle from said unlocked open position to said locked closed position by causing a chamfered surface of said latch to contact an angled surface of an indent formed in the housing when said communication device is being carried via the handle.

2. The communication device according to claim 1, wherein a distance that said handle extends from said front panel while in said locked closed position is greater than a distance that each of said plurality of electronic connectors extends from said front panel.

3. The communication device according to claim 1, wherein a distal end of said handle resides a greater distance from said front panel when in said unlocked open position than a distance that each of said plurality of electronic connectors extends from said front panel.

4. The communication device according to claim 1, wherein said value of N is based on a size of each said electronic connector and a distance that a distal end of said handle resides from said housing when said handle is in at least one of said locked closed position and said unlocked open position.

5. The communication device according to claim 1, further comprising a second lock mechanism coupled to said housing and said handle so as to prevent an accidental or unintentional transition of said handle from said locked closed position to said unlocked open position.

6. The communication device according to claim 1, wherein spring normally biases said latch towards said housing.

7. The communication device according to claim 1, further comprising a hinge mechanism comprising a pivot member rotatably disposed in a retaining structure of said housing and a barrel member defining a T-shaped portion of said handle.

8. The communication device according to claim 7, wherein said retaining structure provides structural support to said barrel member so as to prevent damage to said lock mechanism and said pivot member during a drop and collision event.

9. The communication device according to claim 7, wherein said barrel member has a shape allowing only a limited angle of rotation for said handle.

10. The communication device according to claim 1, further comprising an aperture formed through said handle providing a dedicated area for mounting accessories.

11. The communication device according to claim 1, wherein said handle is formed of a material which provides low thermal conduction to a user's hand.

12. The communication device according to claim 1, wherein a hand opening for grasping said handle is larger when said handle is in said unlocked open position as compared to when said handle is in said locked closed position.

13. The communication device according to claim 1, wherein the communication device comprises a second handle which in combination with the first handle defines a plane corresponding to an impact surface for the communication device when dropped.

14. A method for carrying a communication device, comprising:
moving at least one latch in a first direction so as to cause said latch to disengage a housing of said communication device;
resiliently biasing said latch in a direction toward said housing;
transitioning at least a first handle of said communication device from a closed position to an open position by pivoting the first handle in a direction away from said housing, the first handle facilitating carrying of the communication device by a human;
providing the housing with a front panel, and a plurality of sidewalls perpendicular to the front panel;
limiting an angle of rotation of said first handle using a surface of the first handle which is angled a first number of degrees relative to a first one of the plurality of sidewalls of the housing when the first handle is in the open position and angled a second number of degrees relative to the first one of the plurality of sidewalls when the first handle is in the closed position;
wherein the first number of degrees has a value greater than zero, and the second number of degrees has a value which causes the first handle to be substantially aligned with the first one of the plurality of sidewalls; and
preventing an unintentional transition of the first handle from the open position to the closed position by causing a chamfered surface of said latch to contact an angled surface of an indent formed in the housing.

15. The method according to claim 14, further comprising:
pivoting said first handle in a direction towards said housing; and
causing said latch to engage said housing so as to lock said first handle in a locked closed position.

16. The method according to claim 14, further comprising preventing an unintentional pivoting of said first handle away from said housing.

17. The method according to claim 14, wherein a hand opening for grasping said first handle is increased in size when said first handle is pivoted away from said housing.

18. The method according to claim 14, wherein said first handle protects at least one electronic connector from damage during a drop and collision event.

19. The method according to claim 14, further comprising positioning at least a second handle so that said first handle and said second handle together define a plane corresponding to an impact surface for the communication device when dropped.

* * * * *